United States Patent
Shibagaki et al.

(10) Patent No.: US 8,032,015 B2
(45) Date of Patent: Oct. 4, 2011

(54) HEATING APPARATUS, HEATING METHOD, AND SEMICONDUCTOR DEVICE MANUFACTURING METHOD

(75) Inventors: Masami Shibagaki, Fuchu (JP); Hiroshi Doi, Chofu (JP)

(73) Assignee: Canon Anelva Corporation, Kawasaki (JP)

( * ) Notice: Subject to any disclaimer, the term of this patent is extended or adjusted under 35 U.S.C. 154(b) by 356 days.

(21) Appl. No.: 12/368,525

(22) Filed: Feb. 10, 2009

(65) Prior Publication Data

US 2009/0202231 A1    Aug. 13, 2009

(30) Foreign Application Priority Data

Feb. 13, 2008    (JP) ................. 2008-031716

(51) Int. Cl.
   *A21B 2/00*    (2006.01)
(52) U.S. Cl. ........................ 392/416; 392/407
(58) Field of Classification Search ........... 392/407–420
   See application file for complete search history.

(56) References Cited

U.S. PATENT DOCUMENTS

| 7,618,226 B2 * | 11/2009 | Takizawa et al. | ........ 414/416.08 |
| 7,807,553 B2 * | 10/2010 | Shibagaki et al. | ............ 438/522 |
| 2008/0153308 A1 * | 6/2008 | Ogawa et al. | ................. 438/758 |

FOREIGN PATENT DOCUMENTS

| JP | 10-045474 | 2/1998 |
| JP | 2912913 B1 | 12/1999 |
| JP | 2912613 B1 | 1/2000 |
| JP | 2912616 B1 | 2/2000 |

OTHER PUBLICATIONS

Shibagaki, M., et al., "Development of the Novel Bombardment Anneal System (EBAS) for SiC Post Ion Implantation Anneal," Materials Science Forum, vols. 483-485, p. 609-612 (2005).
Kimoto, T., et al., "Nitrogen Ion Implantation into α-SiC Epitaxial Layers," Phys. Stat. Sol., vol. 162, p. 263-276 (1997).

* cited by examiner

*Primary Examiner* — Thor Campbell
(74) *Attorney, Agent, or Firm* — Fitzpatrick, Cella, Harper & Scinto

(57) ABSTRACT

A heating apparatus including a filament arranged in a vacuum heating vessel comprises a base plate arranged in the vacuum heating vessel to fix the filament at a predetermined position with respect to a conductive heater forming one surface of the vacuum heating vessel. The base plate comprises a plate body having a carbon fiber.

6 Claims, 3 Drawing Sheets

HEATING APPARATUS, HEATING METHOD, AND SEMICONDUCTOR DEVICE MANUFACTURING METHOD

BACKGROUND OF THE INVENTION

1. Field of the Invention

The present invention relates to a heating apparatus which heats a substrate in a vacuum quickly, a heating method which employs the heating apparatus, and a semiconductor device manufacturing method employing the heating method.

2. Description of the Related Art

A semiconductor manufacturing technique frequently requires a process for heating a semiconductor substrate quickly. In particular, activation annealing of a wide bandgap semiconductor represented by silicon carbide (SiC) requires a high temperature of approximately 2,000° C. Regarding this, a substrate heating apparatus employing electron impact heating is known in which thermoelectrons are extracted from a filament upon application of an acceleration voltage between the filament and a vacuum vessel, and caused to collide against a heater, thus generating heat (see Japanese Patent Nos. 2912613, 2912616, and 2912913).

FIG. 3 is a view showing the structure of a vacuum heating vessel employing electron impact heating in a conventional heating apparatus.

Referring to FIG. 3, a 120-mm diameter conductive heater 1310 made of graphite (carbon) is present in the upper portion of a vacuum heating vessel 1030 to form one surface of the vacuum heating vessel 1030. In the vacuum heating vessel 1030, a filament 1320 made of tungsten-rhenium is fixed to a base plate 1340 made of molybdenum through tantalum first support columns (filament support columns) 1330. The base plate 1340 is fixed to an intermediate base plate 1370 made of molybdenum through second support columns 1360. Three heat reflecting plates 1350 made of molybdenum are inserted in a direction opposite to the filament 1320. The intermediate base plate 1370 is fixed to a water-cooled flange 1400 through third support columns 1390. Insulation glass members 1380 are arranged on and under the intermediate base plate 1370.

In the conventional heating apparatus, the emissivity of the heat reflecting plates 1350 can be decreased, so heat insulation can be achieved easily, thus improving the heating efficiency. When temperature of the conductive heater is in a high-temperature range, that is, at 2,000° C., the temperature difference between the upper and lower surfaces of the base plate located closest to the filament is large. Hence, the base plate which fixes the columns that support the filament warps to project toward the conductive heater. The support columns accordingly spread outward and apply an excessive force to the filament, thus bending the filament.

In this manner, if an excessive force acts on the filament to bend it, short-circuiting may occur to generate abnormal electric discharge. Also, the electron emission distribution becomes nonuniform and degrades the uniformity of the substrate surface temperature.

Also, when the temperature of the molybdenum base is 1,800° C. or more, sublimated molybdenum may be attached to the insulating glass members, which causes an insulation error soon.

SUMMARY OF THE INVENTION

It is, therefore, an object of the present invention to suppress thermal expansion of the base plate even at a high temperature, thus preventing distortion of the support pillars which support the filament.

According to one aspect of the present invention, there is provided a heating apparatus which includes a filament arranged in a vacuum heating vessel and connected to a filament power supply to generate thermoelectrons, and an acceleration power supply which accelerates the thermoelectrons between the filament and a conductive heater forming one surface of the vacuum heating vessel, and in which the thermoelectrons generated by the filament are caused to collide against the conductive heater to heat the conductive heater, the apparatus comprising a base plate arranged in the vacuum heating vessel to fix the filament at a predetermined position with respect to the conductive heater, wherein the base plate comprises a plate body having a carbon fiber.

According to another aspect of the present invention, there is provided a heating method comprising a heating process of heating a substrate using a heating apparatus according to one aspect of the present invention.

According to still another aspect of the present invention, there is provided a method of manufacturing a semiconductor device made of one of a single-crystal semiconductor and a compound semiconductor, comprising a heating process of heating a substrate using a heating method according to another aspect of the present invention.

The heating apparatus of the present invention can prevent distortion of the support pillars that support the filament by decreasing thermal deformation of the base plate, thus achieving long-term stability of the filament.

When the heating apparatus of the present invention is utilized in a semiconductor element manufacturing apparatus, the semiconductor element productivity can improve greatly.

Further features of the present invention will become apparent from the following description of an exemplary embodiment with reference to the attached drawings.

DESCRIPTION OF THE EMBODIMENT

An exemplary preferred embodiment of the present invention will now be described in detail with reference to the accompanying drawings. Note that the constituent elements described in the embodiment are merely examples. The technical scope of the present invention is determined by the claims and not limited by the following individual embodiment.

Figure 1:
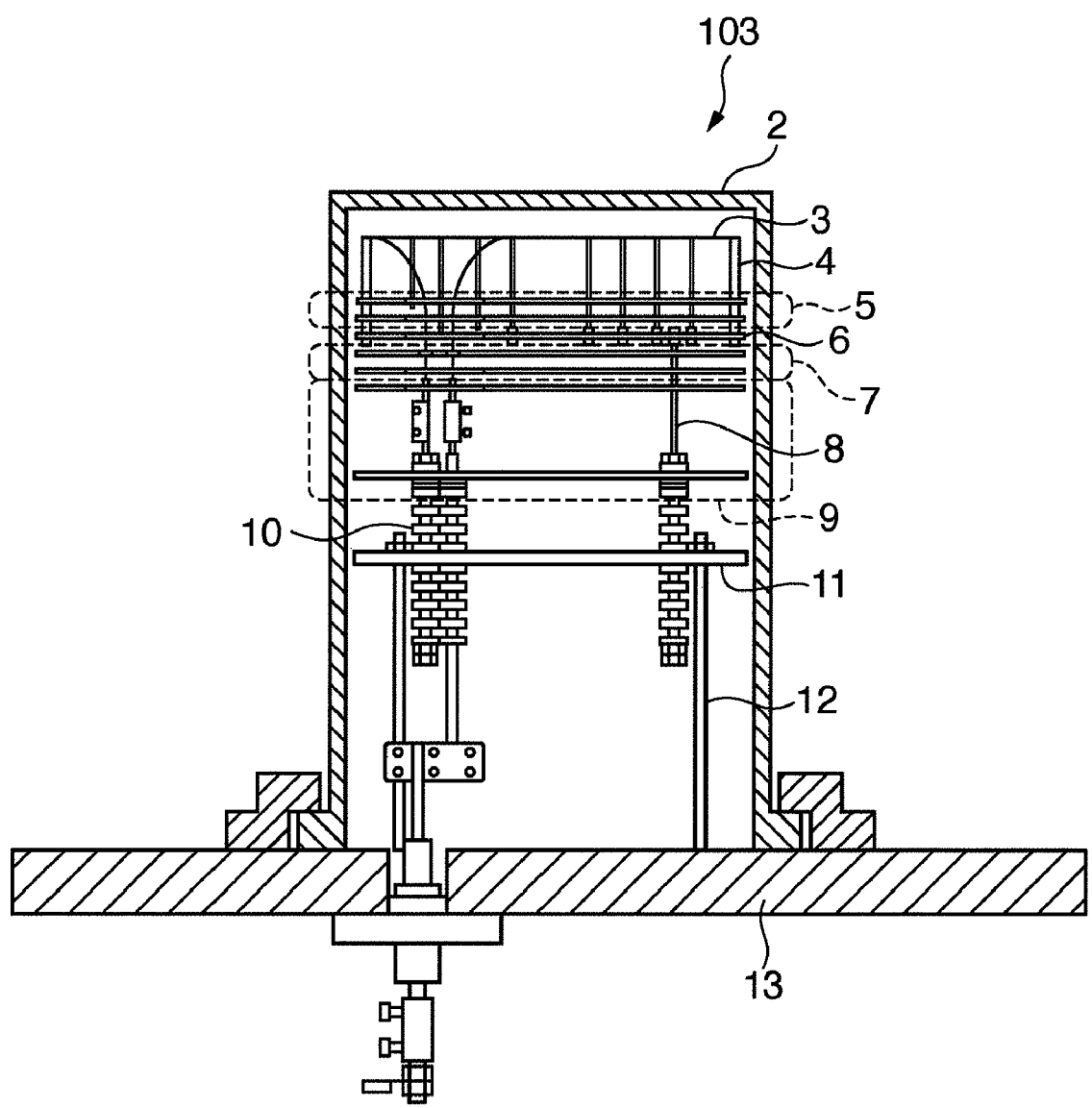
FIG. 1 is a view showing the structure of a vacuum heating vessel which uses a base plate according to the present invention.
Figure 2:
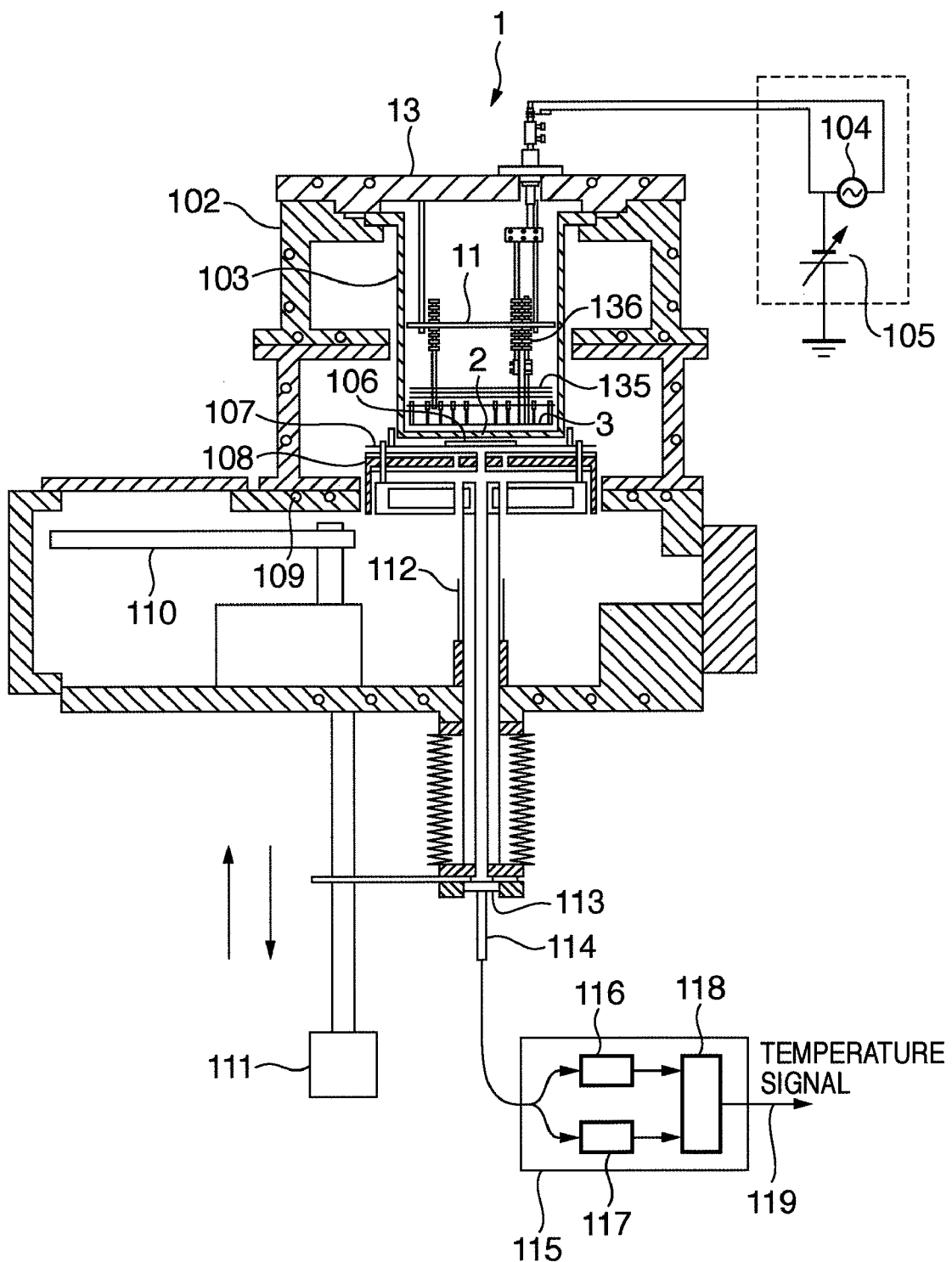
FIG. 2 is a view showing the schematic arrangement of a heating apparatus according to an embodiment of the present invention.
Figure 3:
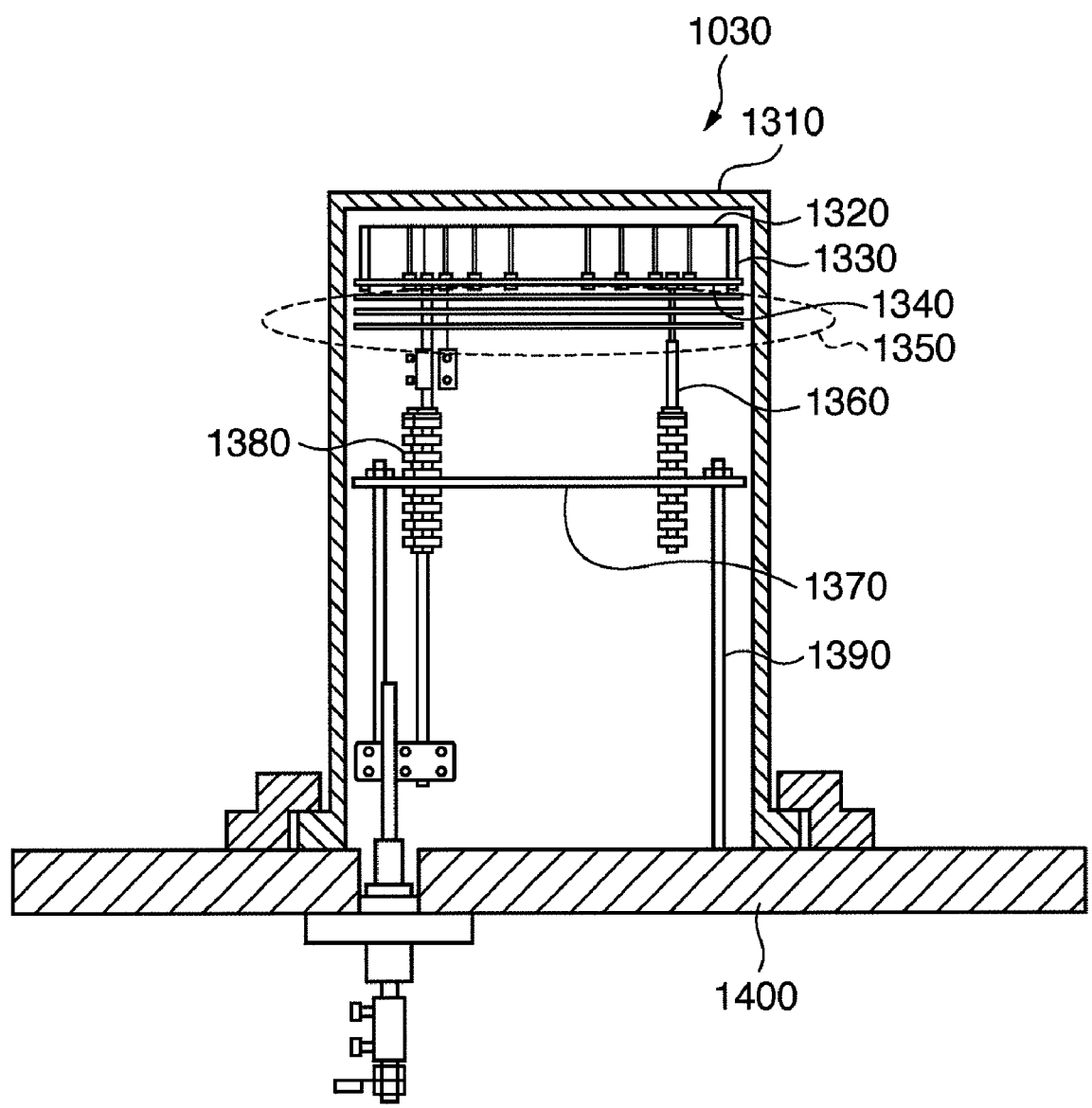
FIG. 3 is a view showing the structure of a vacuum heating vessel in a conventional substrate processing apparatus.

FIG. 2 is a view showing the schematic arrangement of a substrate heating apparatus (to be merely referred to as a "heating apparatus" hereinafter) according to the embodiment of the present invention. Referring to FIG. 2, a heating apparatus 1 has a vacuum heating vessel 103 in a vacuum chamber 102. The vacuum heating vessel 103 includes, under an intermediate base plate 11, heat reflecting plates 135 exemplify first, second and third heat reflecting plates 5, 7 and 9 shown in FIG. 1, a filament 3 made of tungsten-rhenium, and a conductive heater 2. The vacuum chamber 102 includes a water-cooling channel 109. Insulation glass members 136 are arranged on and under the intermediate base plate 11.

The conductive heater 2 is stationarily arranged at the lower portion of the vacuum heating vessel 103. An AC filament power supply 104 causes the filament 3 to emit thermoelectrons. A high-voltage DC power supply 105 applies a high negative potential to the filament 3. The potential difference between the filament 3 and the conductive heater 2 at the ground potential accelerates the thermoelectrons to collide against the conductive heater 2.

A substrate holding table 108, together with a vertical moving mechanism 111, is arranged at a position opposing the conductive heater 2 such that the substrate holding table 108 can be vertically driven by lift pins 112. The substrate holding table 108 supports a substrate stage 107 on which a substrate 106 is to be placed.

A two-color radiation thermometer 115 is incorporated under the substrate holding table 108 through, for example, a transmission window 113 and condensing portion 114.

The two-color radiation thermometer 115 comprises a wavelength detection element a 116, wavelength detection element b 117, and arithmetic circuit 118, and outputs a temperature signal 119 from the arithmetic circuit 118. The two-color radiation thermometer 115 measures the temperature of the lower surface of the substrate stage 107, and controls a filament current value to be applied to the filament 3 through the arithmetic circuit 118 such that the substrate stage 107 reaches a desired temperature.

When transporting the substrate 106 to be processed to the substrate stage 107 and loading the substrate 106 on the substrate stage 107, the substrate holding table 108 moves downward. The substrate holding table 108 and substrate stage 107 have holes through which the lift pins 112 can extend. When the substrate holding table 108 is at the lowermost portion, the distal ends of the lift pins 112 project from the substrate stage 107. A water-cooled shutter 110 as a heat insulation plate is inserted between the conductive heater 2 and substrate holding table 108 to thermally isolate them. A transport chamber (not shown) is separated from the vacuum chamber 102 by a slit valve and evacuated to a vacuum. When the slit valve is opened, an arm (not shown) on which the substrate 106 is placed stretches from the transport chamber and places the substrate 106 on the substrate holding table 108. The arm then contracts, and the slit valve is closed. After that, the substrate holding table 108 moves upward, and the substrate stage 107 on the substrate holding table 108 lifts the substrate 106 from the lift pins 112. The substrate 106 is transferred from the lift pins 112 to the substrate stage 107 made of pyrolytic carbon. The substrate holding table 108 is positioned such that the distance between the conductive heater 2 and substrate 106 is, for example, 5 mm.

The heating apparatus according to the embodiment of the present invention is a heating apparatus which heats a semiconductor substrate in a vacuum by electron impact heating. The filament, base plate, and heat reflecting plate to be mounted in the heating apparatus are roughly as follows.

In the heating apparatus, as the base plate which fixes the filament in the vacuum heating vessel, a plate body having carbon fibers as the material with a coefficient of linear thermal expansion of almost close to zero, for example, a CC composite, is employed. This can suppress thermal expansion of the base plate even at a temperature as high as 2,000° C., so that distortion of the support columns which support the filament can be prevented.

One or more upper heat reflecting plates and one or more lower heat reflecting plates vertically sandwich the base plate. The heat reflecting plates are made of a high-emissivity material represented by pyrolytic carbon, carbon coated with pyrolytic carbon, a CC composite, a CC composite that has undergone a pyrolytic carbon process, or glass-like carbon. This decreases the temperature difference between the upper and lower surfaces of the base plate. Hence, distortion of the base plate caused by thermal expansion can be further reduced.

Furthermore, one or more heat reflecting plates made of a refractory metal such as molybdenum are inserted between the base plate and intermediate plate. The surfaces of the heat reflecting plates are mirror-finished to decrease the emissivity (to increase the reflectance). This improves the heat insulation efficiency. As a result, the long-term stability and long service life of the filament of the heating apparatus employing electron impact heating can be achieved without impairing the conventional heating efficiency.

FIG. 1 is a view showing the structure of the vacuum heating vessel which employs the base plate. When FIG. 1 is compared with FIG. 2, FIG. 1 shows the vacuum heating vessel upside down in enlargement.

Referring to FIG. 1, in the heating apparatus which heats a substrate in a vacuum by electron impact heating, a graphite (carbon)-made conductive heater 2 coated with pyrolytic carbon forms one surface of a vacuum heating vessel 103. The conductive heater 2 and a substrate holding table 108 which oppose each other are arranged in a vacuum chamber (FIG. 2) to be movable in directions to come close to and separate from each other.

In the vacuum heating vessel 103, a filament 3 made of tungsten or tungsten-rhenium is fixed to tantalum first support columns (filament support columns) 4 standing upright on a base plate 6 formed of a plate body having carbon fibers. The base plate 6 is fixed to an intermediate base plate 11 through molybdenum second support columns 8. First and second carbon-made heat reflecting plates 5 and 7 sandwich the base plate 6 and suppress the temperature difference between the upper and lower surfaces of the base plate 6. Furthermore, a plurality of heat reflecting plates 9 are inserted between the second heat reflecting plate 7 under the base plate 6 and the molybdenum intermediate base plate 11 which supports the entire unit formed of the filament 3. The surfaces of the third heat reflecting plates 9 underwent a process to decrease the emissivity. This improves the heating efficiency. The intermediate base plate 11 is fixed to a water-cooled flange 13, serving as the lid of the vacuum chamber, through molybdenum third support columns 12. Insulating glass members 10 are arranged on and under the molybdenum-made intermediate base plate 11.

The filament 3 is provided with an AC power supply for heating, and a high-voltage DC power supply (DC power supply 105 in FIG. 2) which forms a potential difference between the filament and the graphite conductive heater 2.

The base plate 6 formed of the plate body having the carbon fibers, the carbon first and second heat reflecting plates 5 and 7, and the molybdenum third heat reflecting plates 9 are set to have the same potential as that of the filament 3. This is aimed at reflecting thermoelectrons by the reflecting plates efficiently so the thermoelectrons are supplied to the graphite conductive heater 2 efficiently.

The structure of the vacuum heating vessel 103 in the heating apparatus will be described hereinafter with reference to FIG. 1.

Referring to FIG. 1, the molybdenum intermediate base plate 11 is present in the vacuum heating vessel 103 incorporating the 200-mm diameter graphite conductive heater 2 coated with pyrolytic carbon. The intermediate base plate 11 is fixed to the water-cooled flange 13 of the vacuum chamber through the four molybdenum third support columns 12. The base plate 6 is fixed to the intermediate base plate 11 through the second support columns 8. The first support columns 4 fix the filament 3 made of tungsten-rhenium.

The coefficient of linear thermal expansion of molybdenum conventionally used to form the base plate is $7.2 \times 10^{-6}$/K. When the conductive heater 2 is heated to 2,000° C., the difference in elongation between the upper and lower surfaces of the base plate due to the thermal expansion reaches 0.15 mm. This distorts the base plate.

The coefficient of linear thermal expansion of the base plate 6 formed of the plate body having the carbon fibers according to this embodiment is almost 0. Even if a temperature difference exists between the upper and lower surfaces, the difference in elongation due to the thermal expansion is almost 0 mm. Thus, distortion of the base plate 6 is suppressed, and bending of the filament 3 can be prevented.

Furthermore, according to this embodiment, in order to decrease the temperature difference between the upper and lower surfaces of the base plate 6, the base plate 6 is sandwiched by the two carbon first heat reflecting plates 5 and the two carbon second heat reflecting plates 7. The first and second heat reflecting plates 5 and 7 block heat radiation (heat emission) caused by heating the conductive heater 2. This suppresses a temperature difference from occurring between the upper and lower surfaces of the base plate 6. The first heat reflecting plates 5 are arranged between the filament 3 and base plate 6, on the upper surface side of the base plate 6, and block heat radiation caused by heating the conductive heater 2. The second heat reflecting plates 7 are arranged on the lower surface side of the base plate 6, and block heat radiation caused by heating the conductive heater 2. As the first heat reflecting plates 5 and second heat reflecting plates 7 are arranged to sandwich the base plate 6, the temperature difference between the upper and lower surfaces of the base plate 6 can be suppressed to 22° C. or less, so that distortion of the base plate 6 can be further suppressed. Note that the number "2" of first heat reflecting plates 5 and the number "2" of second heat reflecting plates 7 are merely an example, and the gist of the present invention is not limited to this example. As long as the first heat reflecting plates 5 comprise at least one heat reflecting plate 5 and the second heat reflecting plates 7 comprise at least one heat reflecting plate 7, the temperature difference between the upper and lower surfaces of the base plate 6 can be decreased.

As the material of the carbon first and second heat reflecting plates 5 and 7 described in this embodiment, carbon, pyrolytic carbon, carbon coated with pyrolytic carbon, a CC composite, glass-like carbon, or the like that exhibits a high emissivity, can withstand a high temperature, and does not cause metal contamination can be employed.

If the first and second heat reflecting plates 5 and 7 are made of a material such as the CC composite which has a coefficient of thermal expansion of almost 0, they can be stationarily fixed to the base plate 6 or intermediate base plate 11. If the heat reflecting plates are made of another carbon material or molybdenum, they can be shrinkably/contractably fixed by considering thermal expansion caused by the conductive heater temperature of as high as 2,000° C.

A plurality of carbon heat reflecting plates are sandwiched between the molybdenum third heat reflecting plates 9 which are mirror-finished to decrease the emissivity, and the conductive heater 2. For example, in the arrangement of FIG. 1, five carbon heat reflecting plates (of which one is a base plate formed of a plate body having carbon fibers such as a CC composite) are sandwiched between the third heat reflecting plates 9 and conductive heater 2. More specifically, the base plate 6 is sandwiched by the two carbon first reflecting plates 5 and the two carbon second reflecting plates 7. In this case, the third heat reflecting plates 9 reach 1,429° C. at the highest temperature portion. This can reduce the saturated vapor pressure by two orders of magnitude when compared to the conventional temperature of 1,832° C. Consequently, molybdenum sublimating from the third heat reflecting plates 9 and attached to the insulating glass members 10 can be suppressed. The heating efficiency can thus be set to almost the same level as in the conventional case while greatly reducing the risk of insulation error.

A heating method (to be also referred to as a "processing method" hereinafter) for the substrate 106 using the heating apparatus 1 will now be described. First, the substrate holding table 108 moves upward, and the substrate stage 107 on the substrate holding table 108 lifts the substrate 106 from the lift pins 112. The substrate 106 is transferred from the lift pins 112 to the substrate stage 107. The vertical moving mechanism 111 positions the substrate holding table 108 such that the distance between the conductive heater 2 and substrate 106 is, for example, 5 mm.

After the substrate holding table 108 is positioned, for example, the AC current to the filament 3 is increased from 0 A to 25 A by 1 A/sec, and held at 25 A for 30 sec, thus preheating the filament 3.

After that, the DC power supply 105 increases the voltage flowing between the filament 3 and conductive heater 2 from 0 V to 1,500 V by approximately 50 V/sec, so that the filament 3 emits the thermoelectrons. Then, the emission current is gradually emitted. After the voltage is increased to approximately 1,500 V, the AC current value is increased to approximately 29 A, and simultaneously the voltage of the high-voltage DC power supply 105 is increased to approximately 2,500 V.

While monitoring the temperature of the substrate stage 107 by the two-wavelength-type two-color radiation thermometer 115, the arithmetic circuit 118 controls the AC current value of the filament power supply 104 to increase it to 1,900° C. as a preset temperature in about 3 min. This heating is kept for about 1 min. After heating is kept for about 1 min, the AC power supply and DC power supply are turned off.

The temperature of the conductive heater 2 decreases quickly by radiation. When the temperature of the substrate stage 107 decreases to 1,200° C. (first detection temperature) in, for example, about 1 min, the substrate stage 107 moves downward. Away from the conductive heater 2 by 50 mm, the water-cooled shutter 110 serving as the heat insulation plate is inserted between the conductive heater 2 and substrate stage 107, to cool the substrate 106 quickly.

About 2 min later, when the temperature of the substrate stage 107 drops to, for example, 700° C. or less (second detection temperature), the substrate holding table 108 is moved further downward, and the substrate 106 is transferred onto the lift pins 112. When the downward movement of the substrate holding table 108 is completed, the slit valve is opened.

The arm (not shown) advances into the vacuum chamber 102 from the transport chamber (not shown) separated from the vacuum chamber 102 by the slit valve and evacuated to a vacuum. The arm recovers the heated substrate 106 from the lift pins 112 and transports it to a load-lock chamber (not shown).

When the temperature of the substrate under processing drops to, for example, 150° C. or less (third detection temperature), the lock-lock chamber (not shown) is evacuated to the atmosphere, and the substrate 106 is taken out from it.

In general, silicon carbide (SiC) is available in a plurality of crystal types, that is, 3C, 4H, and 6H. To perform homoepitaxial growth with uniform crystallinity, a silicon carbide (SiC) substrate in which the crystals are inclined by 4° or 80 with respect to the C-axis plane is used.

Other than this substrate, a substrate made of a single-crystal semiconductor such as silicon or a substrate made of a compound semiconductor such as gallium nitride can be used to manufacture a semiconductor device.

While the present invention has been described with reference to an exemplary embodiment, it is to be understood that the invention is not limited to the disclosed exemplary embodiment. The scope of the following claims is to be accorded the broadest interpretation so as to encompass all such modifications and equivalent structures and functions.

This application claims the benefit of Japanese Patent Application No. 2008-031716, filed Feb. 13, 2008, which is hereby incorporated by reference herein in its entirety.

What is claimed is:

1. A heating apparatus, which includes a filament arranged in a vacuum heating vessel and connected to a filament power supply to generate thermoelectrons, wherein an acceleration power supply accelerates the thermoelectrons between the filament and a conductive heater forming one surface of the vacuum heating vessel, and wherein the thermoelectrons generated by the filament are caused to collide against the conductive heater to heat the conductive heater, the apparatus comprising:

a base plate arranged in the vacuum heating vessel to fix the filament at a predetermined position with respect to the conductive heater, wherein the base plate includes a plate body having a carbon fiber; and a plurality of plates configured to sandwich the base plate and reflect heat.

2. The apparatus according to claim 1, wherein the carbon fiber is woven or knitted in the base plate.

3. The apparatus according to claim 1,
wherein the plurality of plates includes:
a first heat reflecting plate arranged between the filament and the base plate, on an upper surface side of the base plate, to block heat radiation generated by heating the conductive heater, and
a second heat reflecting plate arranged on a lower surface side of the base plate to block heat radiation generated by heating the conductive heater, and
wherein the first heat reflecting plate and the second heat reflecting plate are arranged in the vacuum heating vessel to sandwich the base plate.

4. A heating method comprising a heating process of heating a substrate using a heating apparatus according to claim 1.

5. A method of manufacturing a semiconductor device made of one of a single-crystal semiconductor and a compound semiconductor, comprising a heating process of heating a substrate using a heating method according to claim 4.

6. A heating apparatus that includes a filament arranged in a vacuum heating vessel and connected to a filament power supply to generate thermoelectrons, wherein an acceleration power supply accelerates the thermoelectrons between the filament and a conductive heater forming one surface of the vacuum heating vessel, and wherein the thermoelectrons generated by the filament are caused to collide against the conductive heater to heat the conductive heater, the apparatus comprising:

a base plate arranged in the vacuum heating vessel to fix the filament at a predetermined position with respect to the conductive heater, wherein the base plate includes a plate body having a carbon fiber;

a first heat reflecting plate arranged between the filament and the base plate, on an upper surface side of the base plate, to block heat radiation generated by heating the conductive heater, and a second heat reflecting plate arranged on a lower surface side of the base plate to block heat radiation generated by heating the conductive heater, wherein the first heat reflecting plate and the second heat reflecting plate are arranged in the vacuum heating vessel to sandwich the base plate.

* * * * *